United States Patent
Kruecken et al.

(10) Patent No.: US 9,620,701 B2
(45) Date of Patent: Apr. 11, 2017

(54) PULSE GENERATOR FOR ENERGIZING AN ULTRASONIC TRANSDUCER, A METHOD OF OPERATING THE PULSE GENERATOR AND A ULTRASONIC DISTANCE SENSING SYSTEM

(71) Applicant: FREESCALE SEMICONDUCTOR, INC., Austin, TX (US)

(72) Inventors: Josef Maria Joachim Kruecken, Munich (DE); Andreas Laudenbach, Haag (DE)

(73) Assignee: NXP USA, Inc., Austin, TX (US)

( * ) Notice: Subject to any disclaimer, the term of this patent is extended or adjusted under 35 U.S.C. 154(b) by 240 days.

(21) Appl. No.: 14/666,883

(22) Filed: Mar. 24, 2015

(65) Prior Publication Data

US 2016/0284967 A1    Sep. 29, 2016

(51) Int. Cl.
*H01L 41/04* (2006.01)
*G01S 15/10* (2006.01)
*G01S 15/93* (2006.01)
*G01S 7/524* (2006.01)

(52) U.S. Cl.
CPC ............ *H01L 41/042* (2013.01); *G01S 7/524* (2013.01); *G01S 15/10* (2013.01); *G01S 15/931* (2013.01)

(58) Field of Classification Search
CPC ..... H01L 41/042; G01S 15/931; G01S 7/524; G01S 15/10
See application file for complete search history.

(56) References Cited

U.S. PATENT DOCUMENTS

| | | |
|---|---|---|
| 5,212,467 A | 5/1993 | Park |
| 5,483,501 A | 1/1996 | Park et al. |
| 6,163,253 A | 12/2000 | Yaron et al. |
| 2014/0043940 A1* | 2/2014 | Niwa ............... G10K 11/18 367/87 |
| 2016/0284967 A1* | 9/2016 | Kruecken ............ H01L 41/042 |

* cited by examiner

Primary Examiner — Daniel Pihulic (57) ABSTRACT

The present application relates to a pulse generator for energizing an ultrasonic transducer, a method of operating thereof and an ultrasonic distance sensing system comprising the pulse generator. The pulse generator is arranged to generate an excitation pulse sequence comprising a first number of pulses; to generate a cancellation pulse sequence comprising at least a fractional pulse, wherein the cancellation pulse sequence has a phase shift of about 180° in relation to the excitation pulse sequence; and to output at an output of the generator the excitation pulse sequence and the cancellation pulse sequence forming an energizing pulse sequence to the ultrasonic transducer.

20 Claims, 6 Drawing Sheets

PULSE GENERATOR FOR ENERGIZING AN ULTRASONIC TRANSDUCER, A METHOD OF OPERATING THE PULSE GENERATOR AND A ULTRASONIC DISTANCE SENSING SYSTEM

FIELD OF THE INVENTION

The present disclosure relates generally to ultrasonic transducers, in particular to a driving circuit for ultrasonic transducers and method of operating the driving circuit.

BACKGROUND

Ultrasonic sensing systems provide an efficient and effective method of distance detection. These sensors require the use of a transducer as an ultrasonic transmitter to produce ultrasonic signals. These signals are propagated through a sensing medium and reflected by objects, in particular at a boundary surface of medium and object, at which the sonic speed changes. The same ultrasonic transducer may be used as an ultrasonic receiver to detect returning signals. Ultrasonic distance sensing systems are popular in vehicle application to detect the distance between vehicle front and/or rear and obstacles. The sensing medium is air. Several transducers are capable of accomplishing this function including such as piezoelectric transducers.

Ultrasonic transducers have been designed to have very good long range detection capabilities. In designing these sensors, it was always necessary to maximize the Q value of the transducer and minimize the frequency of operation. High Q amplifies the returning signal, and low frequency serves to reduce the attenuation of ultrasound in air because attenuation is a function of frequency. These prior art sensors, however, do not display the short range sensitivity provided by the present application.

SUMMARY

The present invention provides a pulse generator for energizing an ultrasonic transducer, a method of operating the pulse generator and an ultrasonic distance sensing system as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION

Embodiments of the present disclosure will be described below in detail with reference to drawings. Note that the same reference numerals are used to represent identical or equivalent elements in figures, and the description thereof will not be repeated. The embodiments set forth below represent the necessary information to enable those skilled in the art to practice the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
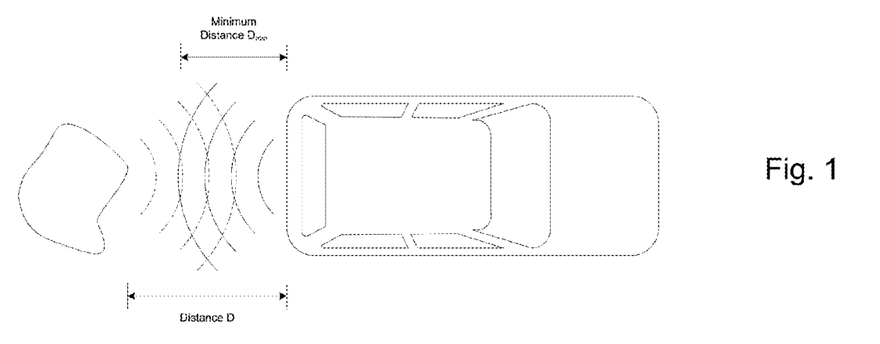
FIG. 1 schematically illustrates an ultrasonic distance sensing system of a vehicle according to an example of the present invention.

Referring to FIG. 1, ultrasonic transducers are used in ultrasonic distance sensing system as known from distance measuring and/or warning systems supporting a driver of a vehicle to maneuver a vehicle in an environment with obstacles. Such ultrasonic distance sensing system comprises one or more ultrasonic transducers arranged at the rear, the front and/or the sides of a vehicle. For the sake of explanation but without limiting the present application thereto, a vehicle 10 as shown in FIG. 1 is equipped with an ultrasonic transducer 200 for ultrasonic distance sensing embedded in the bumper bar at the rear side. For instance, an ultrasonic pulse signal of a predefined length is generated by the ultrasonic transducer 200 and emitted at a predefined aperture of the ultrasonic transducer 200. The emitted pulse signal propagates through the air and is reflected once it meets an obstacle 20. At least a part of the reflected ultrasonic pulse signal propagates back to the ultrasonic transducer 200, which operates as an ultrasonic receiver detecting the returning reflected ultrasonic pulse. The time of travel $t_{travel}$ of the returning reflected ultrasonic pulse signal can be determined starting with the pulse generation. The distance D can be obtained by putting the determined time of travel $t_{travel}$ and the sonic speed $c_{sonic}$ into relationship:

$$D \cong \frac{t_{travel} \cdot c_{sonic}}{2}.$$

For the sake of completeness, it should be noted that the sonic speed $c_{sonic}$ is dependent on the temperature $T_{temp}$ and pressure $p_{air}$; $c_{sonic} = c_{sonic}(T_{temp}, p_{air})$.

Ultrasonic transducers, in particular piezoelectric and piezoceramic ultrasonic transducers, are known to have a ringing or resonant characteristic. More specifically, when an excitation signal for the ultrasonic transducer is removed, the ultrasonic transducer continues to resonate, albeit at a continuously decreasing amplitude, due to the resonant nature of the transducer itself. The continued resonating of the ultrasonic transducer produces a residual electric signal, which may interfere with an electric signal produced by the ultrasonic transducer in response to an incoming returning ultrasonic pulse. Hence, a reliable detection of the returning reflected ultrasonic pulse is obtainable once the continuously decreasing resonance amplitude of the ultrasonic transducer has fallen below threshold.

Accordingly, the ultrasonic distance sensing system has a minimum distance $D_{min}$, at which obstacles can be reliable detected. The minimum distance $D_{min}$ may be considered as an intrinsic characteristic of the ultrasonic distance sensing system and the one or more ultrasonic transducers thereof. Improving the short range sensitivity to reduce the minimum distance $D_{min}$ detectable by an ultrasonic distance sensing system improves the safety level with regard to the automotive use case but opens also new fields of application taking advantage of the improved short range sensitivity.

The resonant characteristic of ultrasonic transducers and the short range sensitivity will be further discussed in the following with reference to FIGS. 2a and 2b.

Figure 2A:
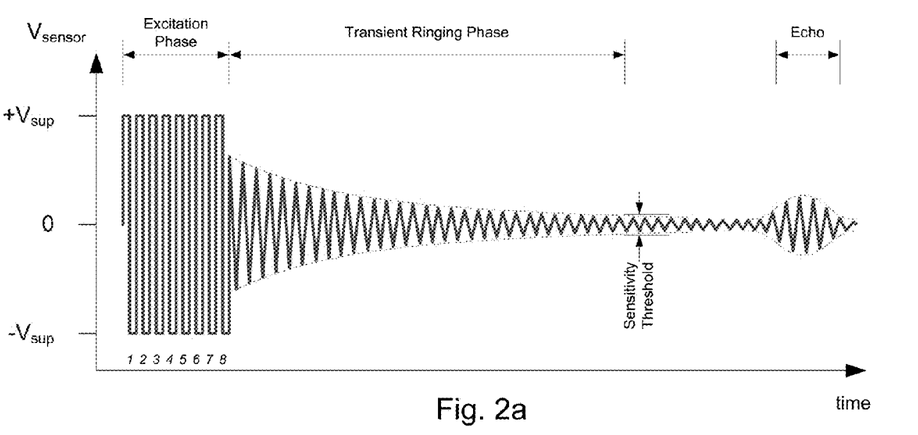
FIG. 2a schematically illustrates a generic diagram of a voltage over time across an ultrasonic transducer with resonant characteristic.

Referring now to FIG. 2a, an exemplary voltage signal $V_{sensor}$ over time across an ultrasonic transducer used as a transmitter and receiver is schematically illustrated. The diagram schematically illustrates the ringing phase of such an ultrasonic transducer, which has been excited to vibrate and emit an ultrasonic signal. In operation, when the ultrasonic transducer is used in a distance sensing system, an electric signal is provided to excite the transducer and consequently produce the emitted ultrasonic signal. This energy is provided in a burst such that excitation is removed from the transducer at a point in time. For the sake of explanation, a square pulse signal applied to the ultrasonic transducer over a so-called excitation phase is illustrated. The exemplified square pulse signal comprises a predefined number of square pulses indicated by indexes 1 to 8. When the excitation is abruptly removed, such an ultrasonic transducer has the property of ringing for a predetermined period of time because of its resonant characteristic.

It should be understood that there are several ways to excite the transducer according to an example of the present invention. For instance, the ultrasonic transducer may be driven at a predetermined frequency, which may be near the resonant frequency thereof, or may be at another frequency, which is chosen for some purpose or use cases. Alternatively, the transducer could be "hit" with single pulse of energy, this would cause the transducer to ring at its resonant frequency. Additionally, the transducer could be driven by an unstable control circuit, which would naturally resonate at the circuit's resonant frequency. In all of these alternatives, the transducer will create ultrasonic signals.

The voltage observed on an ultrasonic transducer when excited is depicted in the diagram of FIG. 2a. After excitation is removed, the ultrasonic transducer continues to ring. More specifically, at a time energy is removed from the ultrasonic transducer, the voltage across transducer does not immediately drop to zero due to the resonant characteristic thereof but commences to ring. The amplitude of the voltage across the ultrasonic transducer may for instance drop as an exponentially damped sinusoid.

The duration of a so-called ringing phase determines the minimum detectable distance of an ultrasonic transducer base distance sensing system. As well understood by those skilled in the art, when ultrasonic signals propagates through a medium such as air, the amplitude thereof attenuates over time. In designing a distance sensing system using ultrasonic signals, it is therefore necessary to account for this attenuation when designing the sensitivity of one or more ultrasonic transducers of the system. In particular, such ultrasonic distance sensing system must be capable of detecting the attenuated return signals.

However, the ringing characteristic eliminates the ability to use ultrasonic transducers at very short ranges. When excitation is removed from the ultrasonic transducer, it is incapable of sensing any return signals created until the residual resonance (ringing) is damped below a return signal amplitude level that returning signals would produce. As the objects being sensed create reflections or returning signals, it is essential that the signals produced by the ultrasonic transducer upon receiving the ultrasonic returning signals are distinguishable from the ringing signal.

Figure 2B:
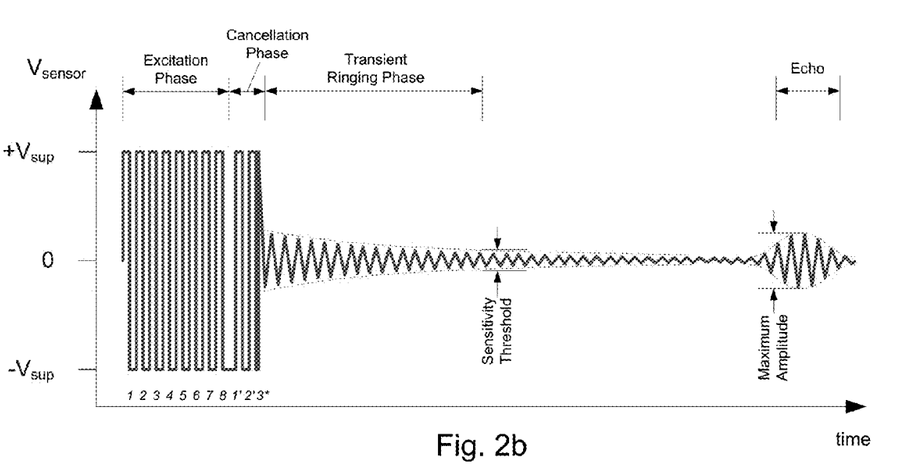
FIG. 2b schematically illustrates a generic diagram of a voltage over time across an ultrasonic transducer energized in accordance with an example of the present invention.

Referring now to FIG. 2b, an exemplary voltage signal $V_{sensor}$ over time across an ultrasonic transducer used as an ultrasonic transmitter and receiver is schematically illustrated. The diagram schematically illustrates the ringing phase of such an ultrasonic transducer, which ringing due to resonate nature of the ultrasonic transducer is attenuated with the help of a cancellation sequence. As illustrated in the diagram of FIG. 2b, the voltage across the ultrasonic sensor must drop below a sensitivity threshold level before the ultrasonic transducer is capable of reliable sensing and detecting attenuated returning signals. Consequently, short range detection using ultrasonic transducers requires a fast drop of the voltage signal across an ultrasonic transduce due to ringing, which hence results in a short ringing phase.

A fast drop of the voltage signal across the ultrasonic transduce during the ringing phase after removal of the excitation signal is obtained by applying a cancellation signal following the excitation signal as further illustratively shown in FIG. 2b. The cancellation signal comprises a square pulse signal, which is 180° phase-shifted with respect to the excitation square pulse comprises a predetermined number of square pulses indicated by indexes 1' and 2' as well as a following final fractional pulse indicated by indexes 3*. Applying the cancellation signal in a so-called cancellation phase following the excitation phase allows for significantly attenuating the amplitude of the ringing signal, which occurs after energy for excitation is removed from the ultrasonic transducer.

As a consequence of the attenuated ringing signal, ringing phase, during which the ultrasonic transducer is inapplicable to reliable detect an ultrasonic return signal due to overlap of the ringing and ultrasonic return signals, is significantly shortened. As a result thereof, the minimum detectable distance of an ultrasonic distance sensing system can be significantly reduced by applying the cancellation signal according to an example of the present application.

Figure 3:
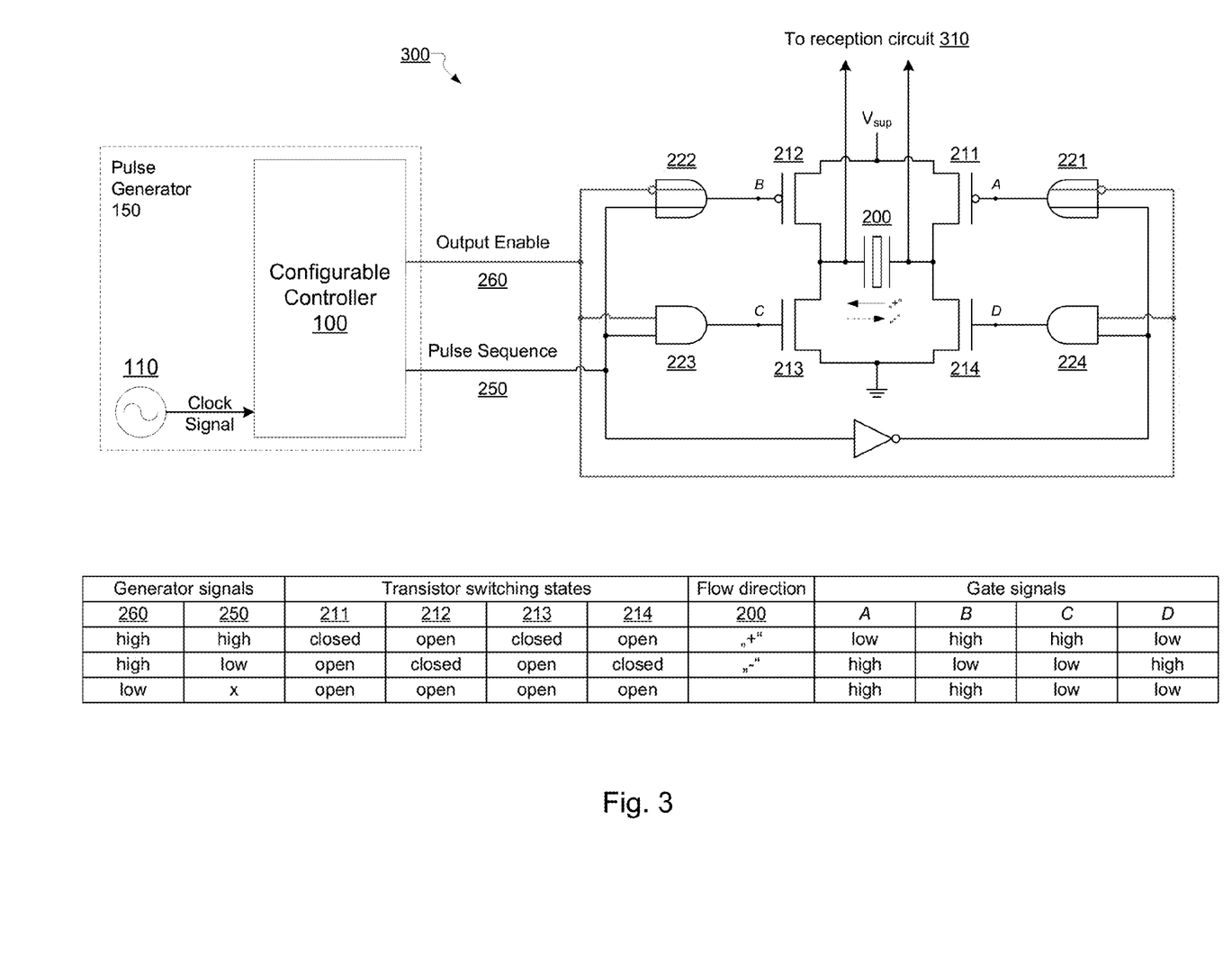
FIG. 3 schematically illustrates a circuit diagram of a transmitting circuit with an H-bridge circuit and a pulse generator for energizing an ultrasonic transducer 200 according to an example of the present invention.

Referring to FIG. 3, a schematic circuit diagram showing a transmitting circuit 300 comprising an H-bridge circuitry for energizing an ultrasonic transducer 200 and a pulse generator 150 is illustrated. The H-bridge circuitry comprises the transistors 211 to 214. A bi-level pulse sequence signal 250 outputted by a pulse generator 150 is used to control the switching states of the transistors 211 to 214. The transistors 211 to 214 are used as controllable switching components, which switching state comprises blocked state and conductive state controlled through the respective gate.

In the example of FIG. 3, the transistors 211 and 212 are embodied as p-type metal-oxide-semiconductor field-effect transistors (p-MOSFETs), which are conductive (closed switching state) when the gate is at low level and which are non-conductive (open switching state) when the gate is at high level. The transistors 213 and 214 are embodied as n-type metal-oxide-semiconductor field-effect transistors (n-MOSFETs), which are conductive (closed switching state) when the gate is at high level and which are non-conductive (open switching state) when the gate is at low level.

The bi-level pulse sequence signal 250 may alternate between a high level and a low level at a predefined frequency. The bi-level pulse sequence signal 250 is supplied to the gates of the transistors 212 and 213 and an inverted sequence signal of the bi-level pulse sequence signal 250 is supplied to the transistors 211 and 214. The inverted sequence signal should be understood to be inverted with respect to the signal level of the bi-level pulse sequence signal 250.

In case the bi-level pulse sequence signal 250 is at high level, the transistors 211 and 213 are in conductive state and the transistors 212 and 214 are in non-conductive state. Accordingly, a current flows from a constant voltage power source (not shown) having the supply voltage $V_{sup}$ through the transistor 211, the ultrasonic transducer 200 and further the transistor 213. Without limiting the scope of the present application, the direction of the current through the ultrasonic transducer 200 is designated as "+" current direction as illustrated in FIG. 3.

In case the bi-level pulse sequence signal 250 is at low level, the transistors 212 and 214 are in conductive state and the transistors 211 and 213 are in non-conductive state. Accordingly, a current flows from the power source through the transistor 212, the ultrasonic transducer 200 and further the transistor 214. Without limiting the scope of the present application, the direction of the current through the ultrasonic transducer 200 is designated as "−" current direction as illustrated in FIG. 3.

The pulse generator 150 further outputs a bi-level output enable signal 260. The bi-level enable signal 260 allows for switching the transistors 211 to 214 into non-conductive state such that ultrasonic transducer 200 can be coupled in a high-ohmic way to a receiving circuit (not shown). In the example shown in FIG. 3, an output enable signal at low level switches the transistors 211 to 214 into non-conductive state, whereas the output enable signal at high level enables controlling the switching states of the transistors 211 to 214 by the pulse sequence signal 250 as described above. Logic components 221 to 224 are arranged at the gates of transistors 211 to 214 to produce a respective gate signal A to D controlling the switching state of the transistors 211 to 214 as illustrated in the table shown in FIG. 3.

The pulse generator 150 comprises a configurable controller 100 and a clock signal generator 110 and is arranged to output the output enable signal 260 and the pulse sequence signal 250. The operation of the pulse generator 150 will be described below with reference to FIGS. 4 to 7.

Those skilled in the art will understand that the illustrated transmitting circuit of FIG. 3 with H-bridge circuitry for energizing the ultrasonic transducer 200 is only one possible circuit for energizing an ultrasonic transducer 200. Further, those skilled in the art appreciate that the implementation of the receiving circuit (310) is out of the scope of the present application.

Figure 4:
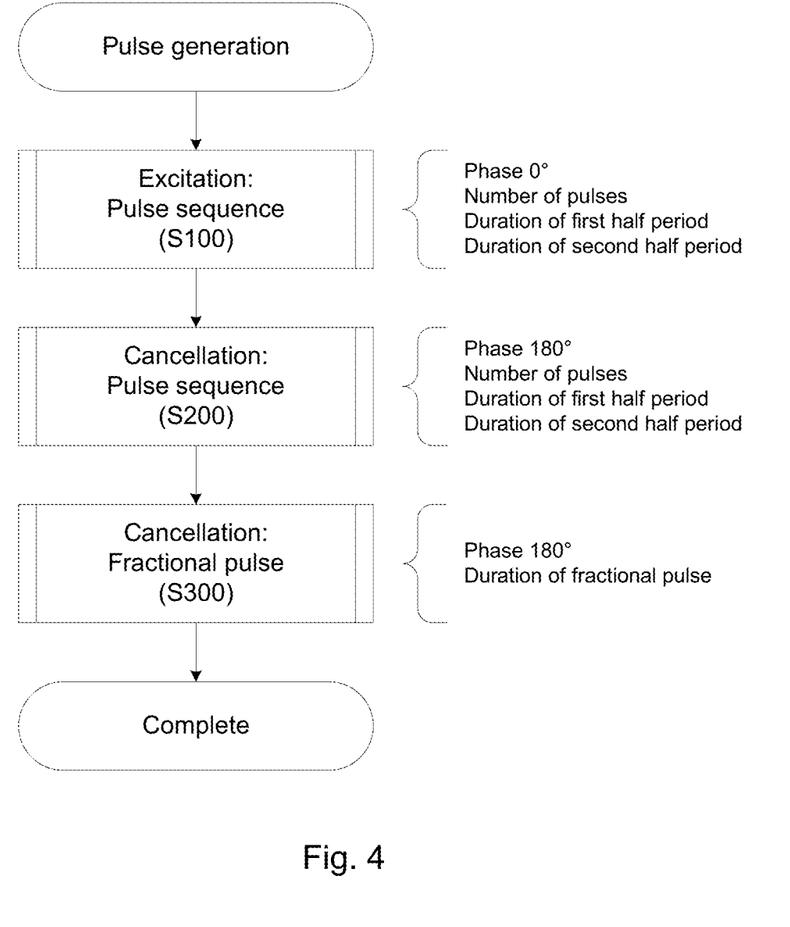
FIG. 4 schematically illustrates a flow diagram of a sequence of generating an energizing pulse sequence for an ultrasonic transducer according to an example of the present invention.

With reference to FIG. 4, a flow diagram schematically illustrating the generation of a sequence of energizing an ultrasonic transducer is shown. The sequence of energizing an ultrasonic transducer as described in the following is well understood with regard to the exemplified H-bridge circuitry shown in FIG. 3. In particular, the sequence of energizing represents a control signal in accordance with which an ultrasonic transducer is energized. Nevertheless, the sequence of energizing may be also supplied directly to an ultrasonic transducer for driving the ultrasonic transducer.

The sequence of energizing first comprises generating an excitation pulse sequence for exciting the transducer to vibrate and emit an ultrasonic signal in an operation S100. The excitation pulse sequence comprise a predefined number of pulses. The pulses of the sequence may be periodic at a predefined frequency.

Following, the sequence of energizing further comprises generating a cancellation pulse sequence for at least attenuating the ringing of the transducer in an operation S200. The cancellation pulse sequence comprises a predefined number of pulses. The pulse sequence may be periodic pulse sequence at a predefined frequency. In particular, the frequency of the pulse sequence for exciting and the frequency of the pulse sequence for attenuating may be substantially equal. The phase position of the pulses of the cancellation pulse sequence is phase-shifted with respect to the phase position pulses of the excitation pulse sequence. In particular, the phase of the cancellation pulse sequence is shifted of about 180° in relationship to the phase of the excitation pulse sequence.

Following, the sequence of energizing further comprises generating a fractional pulse, in an operation S300. The fractional pulse contributes to the cancellation pulse sequence. The fractional pulse is substantially in phase with the cancellation pulse sequence. In particular, the phase position of the fractional pulse is shifted in phase of about 180° in relationship to the phase of the excitation pulse sequence.

The pulse sequence and fractional pulse generation may be configurable. The configurability may include at least one of a length in time of a pulse with regard to the pulse period or the half period of a pulse, a number of pulses in a pulse sequence, a phase of the pulse sequence, and a frequency of a pulse sequence. The generation of the pulses may be based on a common clock signal, which serves as a timing circuit supplying a reference unit of time.

The sequence of energizing an ultrasonic transducer will be further described with reference to the FIGS. 5 to 7. The sequence of energizing will be described with respect to sequences comprises square or rectangular pulses with a configurable duty cycle and period of time of the pulses. For the following description those skilled in the art will understand that the teaching of the present application is not limited to a specific pulse shape but can be likewise implemented with other pulse shapes like saw pulses.

The generation of the sequence of energizing an ultrasonic transducer will be described in the following with reference to a pulse generator such as the exemplary pulse generator 150 illustrated in FIG. 3. The operation of the pulse generator 150 and the configurable controller 100 thereof will be described in more detail with reference to the flow diagrams of FIGS. 5 to 7 and will be understood more fully in conjunction with the wave form diagrams of FIGS. 9 to 11 will be understood more fully.

As schematically illustrated in the block diagram of FIG. 3, the pulse generator 150, in particular a square pulse generator, may comprise a clock generator 110 generating a clock signal, which is supplied by the clock generator to a configurable controller 100 coupled to the clock generator 110. The configurable controller 100 operatively controls the outputting of a square pulse sequence signal, which varies between two signal levels including a low level and a high level.

Figure 5:
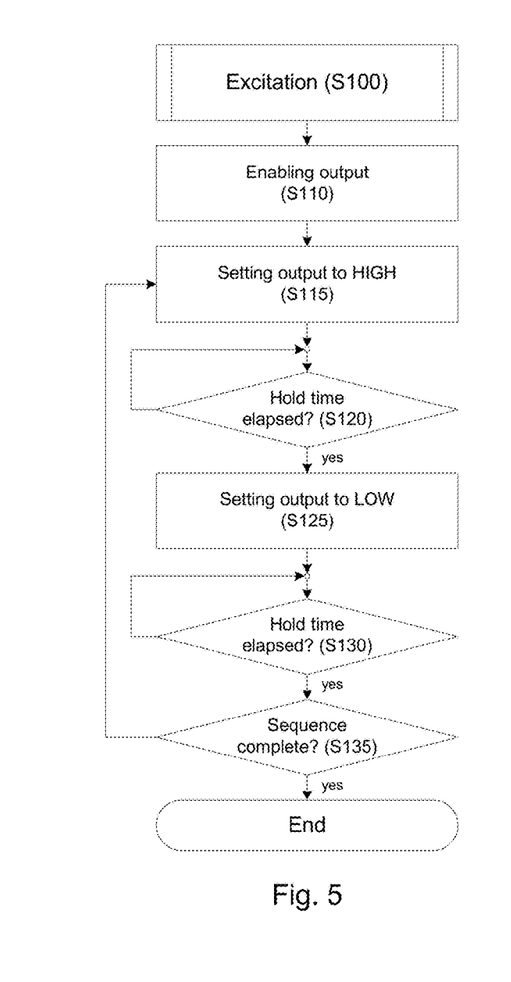
FIG. 5 schematically illustrates a flow diagram of a sequence for generating an excitation pulse sequence for an ultrasonic transducer according to an example of the present invention.

Referring to FIG. 5, a flow diagram schematically illustrating the generation of the excitation pulse sequence is shown. The exemplarily illustrated sequence for generation an excitation pulse sequence is configurable with respect to the number of pulses to be generated and the duty cycle of square pulses forming the excitation sequence. The algorithm of the illustrated sequence accepts a configurable hold high time for the duration, during which each pulse is set to high level, and a configurable hold low time for the duration, during which each pulse is set to low level.

The output of the square wave generator, at which the sequence for exciting the ultrasonic transducer is provided, may be enabled in an operation S110.

The exemplary square wave generates a sequence of a predefined number of bi-level square pulses for exciting the ultrasonic transducer. The two levels include a high level and a low level. The first square pulse may start at high level. Those skilled in the art will understand that the present invention is not limited thereto.

The output of the square wave generator is set to high level in an operation S115.

The high level output is maintained for a predetermined period of time such as a predefined hold high time for the high signal level of a square pulse, in an operation S120. The predetermined period of time may be based on a common clock signal serving as a timer providing a time unit. The predetermined period of time for maintaining the output level may be defined on the basis of the time unit defined by the clock signal. In particular, the predetermined period of time for maintaining the output level may be defined as a multiple of the time unit defined by the clock signal.

Once, the predetermined period of time for maintaining the output level is elapsed, the output of the square wave generator is set to low level in an operation S125.

The low level output is maintained for a predetermined period of time hold-low time such as a predefined hold low time for the low signal level of a square pulse, in an operation S130. The predetermined period of time may be based on a common clock signal serving as a timer providing a time unit. The predetermined period of time for maintaining the output level may be defined on the basis of the time unit defined by the clock signal. In particular, the predetermined period of time for maintaining the output level may be defined as a multiple of the time unit defined by the clock signal.

Once, the predetermined period of time for maintaining the output level is elapsed, the first square pulse of the excitation pulse sequence is generated and outputted.

The operational flow to generate an excitation square pulse is repeated continuing with setting the output of the square wave generator to high level in the operation S115 until the predefined number of square pulses forming the excitation pulse sequence is generated. Otherwise, once the predefined number of square pulses is outputted, the operational flow of generating the excitation pulse sequence, operation S100, is completed.

The operational sequence detailed above may be further fully understood with reference to and in conjunction with the following C-like operational code to be carried out on a programmable controller such as the configurable controller 100.

| | | |
|---|---|---|
| OutputEnable = High; | // | enable the driver (generator) |
| // Count full excitation pulses high & low | | |
| CountPulses = NumExcitationPulses; | // | predefined number of pulses for excitation |
| | // | |
| do { | // | loop |
|   CountPhase = DurationHigh; | // | defines the time period, during which the output |
| | // | signal is high |
| | // | |
|   Output = High; | // | set output level to high |
|   while (CountPhase-- > 0); | // | executed in hardware at every clock |
| | // | |
|   CountPhase = DurationLow; | // | defines the time period, during at which the output |
| | // | signal is low |
| | // | |
|   Output = Low; | // | set output level to low |
|   while (CountPhase-- > 0); | // | executed in hardware at every clock |
| | // | |
| } while (CountPulses-- > 0); | // | number of generated pulses equal to defined number? |
| | // | |
| // End of excitation phase | | |
| // Output is at low | | |

Figure 6:
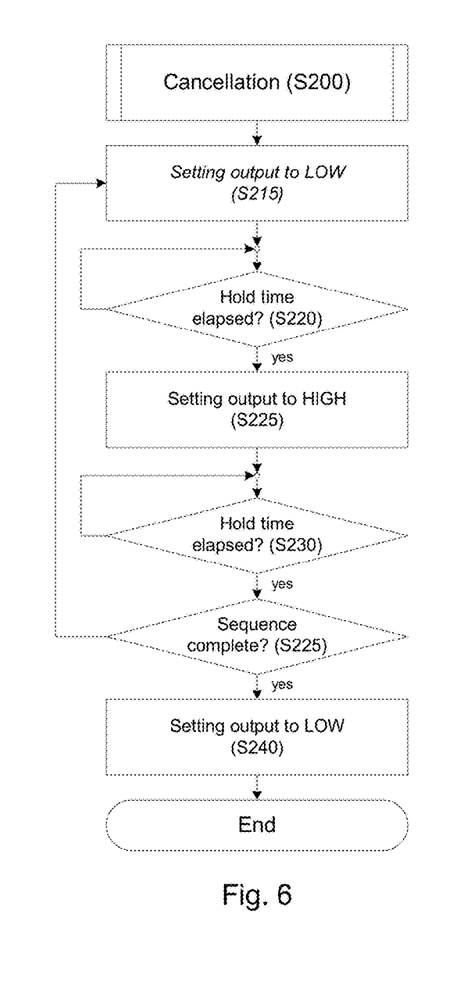
FIG. 6 schematically illustrates a flow diagram of a sequence for generating a cancellation pulse sequence for an ultrasonic transducer according to an example of the present invention.

Referring to FIG. 6, a flow diagram schematically illustrating the generation of the cancellation pulse sequence is shown. The exemplarily illustrated sequence for generation a cancellation pulse sequence is configurable with respect to the duty cycle of square pulses forming the cancellation sequence. The algorithm of the illustrated sequence accepts a configurable hold-high time for the duration, during which each pulse is set to high level, and a configurable hold-low time for the duration, during which each pulse is set to low level.

The exemplary square wave generates a sequence of a predefined number of bi-level square pulses for attenuating the ringing of the ultrasonic transducer after excitation thereof. The first square pulse may start at low level, which substantially corresponds to a 180° phase shift with respect to the excitation pulse sequence. Those skilled in the art will understand that the present invention is not limited thereto.

The output of the square wave generator is set to low level in an operation S215.

The low level output is maintained for a predetermined period of time such as a predefined hold-low time for the low signal level of a square pulse, in an operation S220. The predetermined period of time may be based on a common clock signal serving as a timer providing a time unit. The predetermined period of time for maintaining the output level may be defined on the basis of the time unit defined by the clock signal. In particular, the predetermined period of time for maintaining the output level may be defined as a multiple of the time unit defined by the clock signal.

Once, the predetermined period of time for maintaining the output level is elapsed, the output of the square wave generator is set to high level in an operation S225.

The high level output is maintained for a predetermined period of time such as a predefined hold-high time for the high signal level of a square pulse, in an operation S230. The predetermined period of time may be based on a common clock signal serving as a timer providing a time unit. The predetermined period of time for maintaining the output level may be defined on the basis of the time unit defined by the clock signal. In particular, the predetermined period of time for maintaining the output level may be defined as a multiple of the time unit defined by the clock signal.

Once, the predetermined period of time for maintaining the output level is elapsed, the first square pulse of the cancellation pulse sequence is generated and outputted.

The operational flow to generate a cancellation square pulse is repeated continuing with setting the output of the square wave generator to low level in the operation S215 until the predefined number of square pulses forming the cancellation pulse sequence is generated. Otherwise, once the predefined number of square pulses is outputted, the operational flow of generating the cancellation pulse sequence, operation S200, is completed.

The operational sequence detailed above may be further fully understood with reference to and in conjunction with the following C-like operational code to be carried out on a programmable controller such as the configurable controller 100.

```
OutputEnable = High;           //    enable the driver
                                     (generator)
// Count full cancellation pulses low & high
CountPulses =                  //    predefined number of
NumCancellationPulses;               pulses for cancellation
                               //
do {                           //    loop
   CountPhase = DurationLow;   //    defines the time period,
                                     during which the output
                               //    signal is low
                               //
   Output = Low;               //    start is now low = 180°
                                     phase shift
                               //    set output level to low
                                     for clarification:
                               //    output already at low
                               //
                               //
   while (CountPhase-- > 0);   //    executed in hardware at
                                     every clock
                               //
   CountPhase = DurationHigh;  //    defines the time period,
                                     during at which the output
                               //    signal is high
                               //
   while (CountPhase-- > 0);   //    executed in hardware at
                                     every clock
                               //
} while (CountPulses-- > 0);   //    number of generated pulses
                                     equal to defined number?
                               //
Output = Low;                  //    set output level to low
// Output is at low
```

Figure 7:
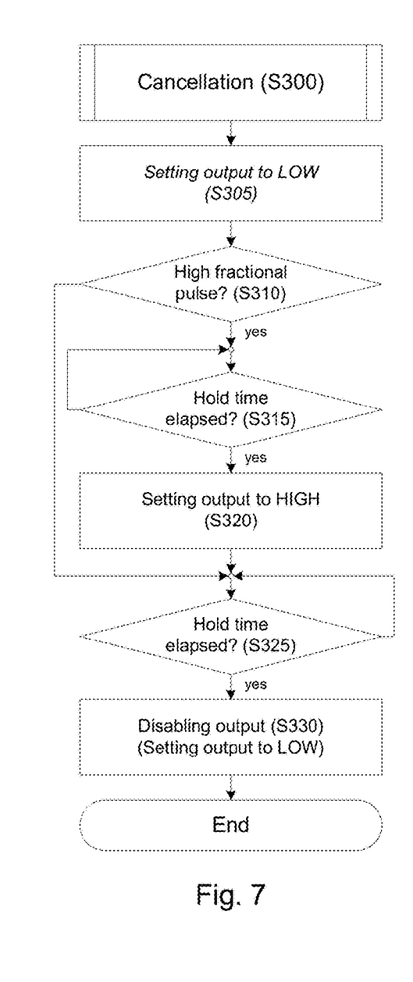
FIG. 7 schematically illustrates a flow diagram of a sequence for generating a fractional cancellation pulse for an ultrasonic transducer according to an example of the present invention.

Referring to FIG. 7, a flow diagram schematically illustrating the generation of fractional pulse being part of the cancellation pulse sequence is shown. The fractional pulse may comprise either a complete low phase plus a fraction of a high phase or a fraction of a low phase according to the phase of the cancellation pulse sequence and in phase shifted relation to the excitation pulse sequence, respectively. The generation of fractional pulse is configurable with respect to the period of time of the fractional pulse, which may include at least the period of time relating to a fractional phase and eventually the period of time of a signal phase. The signal phase should be understood to relate to a period of time, where the pulse signal has a constant level such as high level and low level, respectively.

The output of the square wave generator is set to low level in an operation S305.

In case the fractional pulse comprises a complete low signal phase, operation S310, the low level output is maintained for a predetermined period of time such as a predefined hold-low time for the low signal level of a square pulse, in an operation S315. The predetermined period of time may be based on a common clock signal serving as a timer providing a time unit. The predetermined period of time for maintaining the output level may be defined on the basis of the time unit defined by the clock signal. In particular, the predetermined period of time for maintaining the output level may be defined as a multiple of the time unit defined by the clock signal.

After the predefined hold-low time for the low signal level of a square pulse is elapsed, the output of the square wave generator is set to high level in an operation S320.

In an operation S325, the current level of the output is maintained for a predetermined period of time such as a predefined hold time for the fraction part of the square pulse. In case the fractional pulse comprises a complete low signal phase, the current level of the output is at high level; otherwise the current level of the output is at low level. The predetermined period of time may be based on a common clock signal serving as a timer providing a time unit. The predetermined period of time for maintaining the output level may be defined on the basis of the time unit defined by the clock signal. In particular, the predetermined period of time for maintaining the output level may be defined as a multiple of the time unit defined by the clock signal.

The output of the square wave generator, at which the sequence for exciting the ultrasonic transducer is provided, may be disabled in an operation S330.

The operational sequence detailed above may be further fully understood with reference to and in conjunction with the following C-like operational code to be carried out on a programmable controller such as the configurable controller 100.

```
//    a fractional pulse may comprise either
//       a complete low phase plus a fraction of a high phase
//       (FractionHigh : = 1)
//    or
//       a fraction of a low phase
//       (FractionHigh : = 0)
Output = Low;                  //    set output level to low
                                     for clarification:
                               //    output already at low
                               //
if (FractionHigh == 1) {       //    one complete low phase
                                     since the final high pulse
                               //    takes a fraction
                               //
   CountPhase = DurationLow;   //    defines the time period,
                                     during which the output
                               //    signal is low
                               //
   while (CountPhase-- > 0);   //    executed in hardware at
                                     every clock
                               //
   Output = High;              //    set output level to high
}                              //    low phase complete
CountPhase = FinalFraction;    //    defines the time period
                                     for generating the
```

|  | // | fractional pulse, which the output signal |
|---|---|---|
|  | // |  |
|  | // |  |
| while (CountPhase-- > 0); | // | executed in hardware at every clock |
|  | // |  |
| OutputEnable = Low; | // | disable the driver (generator) |
|  | // |  |
| // end of cancellation phase |  |  |
| // output is disabled (low) |  |  |

Those skilled in the art will understand from the above description that the operational flow to generate the pulse sequence to energize the ultrasonic transducer is merely illustrative. Those skilled in the art will also appreciate from the above description that the configurable parameters including the hold low time and the hold high time (cf. also DurationLow and DurationHigh) may be the same for generating the excitation pulse sequence, the cancellation pulse sequence and the fractional pulse. However, the hold low time and the hold high time (cf. also DurationLow and DurationHigh) may be also different. An individual hold low time and individual hold high time may be used for each of the generation of the excitation pulse sequence, the cancellation pulse sequence and the fractional pulse. The period of a pulse is defined by the sum of the respective hold low time and hold high time. In accordance with the period, a frequency is definable for the pulse sequence with pulses of a predefined period.

It should be noted that the frequency of the energizing pulse sequence is selected to differ from the resonance frequency of the ultrasonic transducer to be energized. In particular, the frequency of the energizing pulse sequence is selected to be apart from the resonance frequency range of the ultrasonic transducer to be energized.

Figure 8:
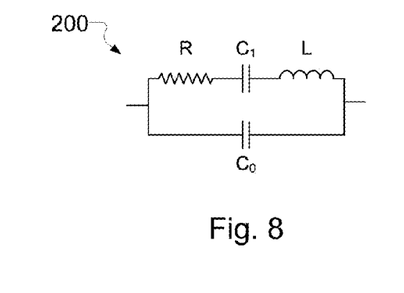
FIG. 8 schematically illustrates a circuit diagram of an equivalent circuit of the transducer, in particular an equivalent circuit of a piezoelectric resonator, according to an embodiment of the present application.

For the sake of further explanation, simulations have been conducted to demonstrate the benefits of the teaching of the present invention. An electric circuit diagram of an electrical equivalent circuit of an ultrasonic transducer 200 is exemplarily illustrated in FIG. 8. Referring specifically now to FIG. 8, there is shown a first capacitance $C_0$, an inductance L, a second capacitance $C_1$, and a resistance R.

The Inductance L and the second capacitance $C_1$ represent the series resonant mode of the ultrasonic transducer. At a frequency slightly above the series resonant frequency, first capacitance $C_0$ resonates with the ultrasonic transducers inductive reactance (presented by the series combination of the inductance L and the second capacitance $C_1$) to produce a parallel resonance. The resistance R is the dissipative element—that part which actually converts electrical current to ultrasound, and therefore consumes power from the energizing circuit. A voltage generator (not shown) may be further arranged in the electrical equivalent circuit as part of the series resonance part of the equivalent circuit. The voltage generator is a voltage source, which represents voltage generated by the ultrasonic transducer when an ultrasonic signal from the environment impinges upon the ultrasonic transducer. Such ultrasonic signal may result from an echo signal of a previously-emanated ultrasonic signal, returning from an object in proximity to the ultrasonic transducer.

For the sake of simulation, the following values have been considered:

$R = 300\,\Omega$;
$C_1 = 66$ pF;
$L = 180$ mH; and
$C_0 = 2.2$ nF.

On the basis of the electrical equivalent circuit illustrated in FIG. 8, simulations have been conducted to demonstrate the effect of the cancellation sequence with fractional pulse on the ringing phase of an ultrasonic transducer 200.

Figure 9:
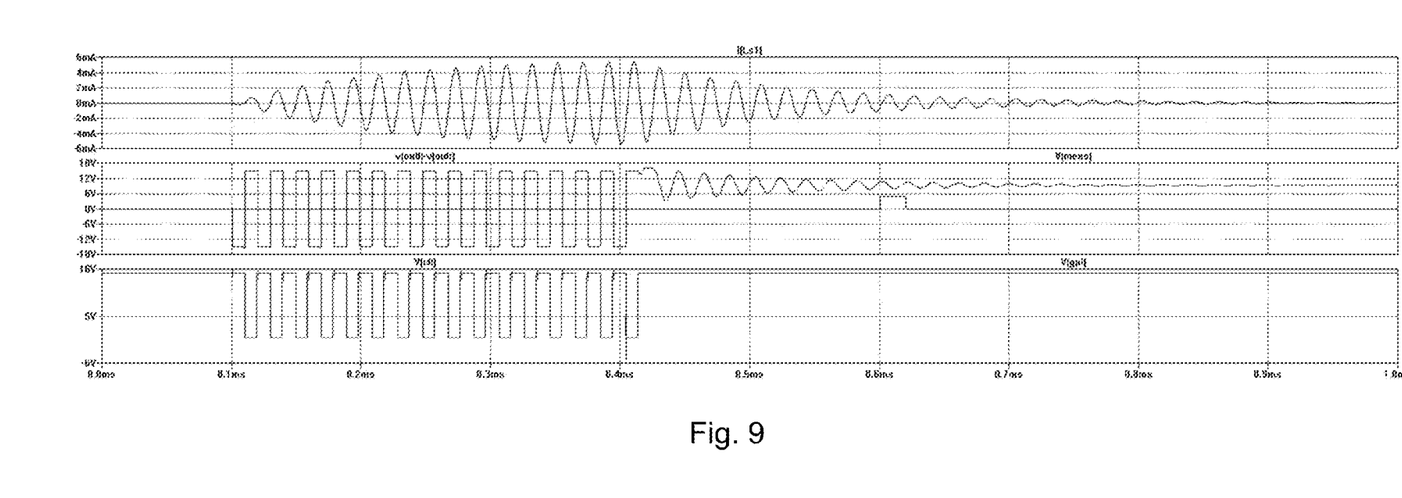
FIGS. 9 to 11 show waveform diagrams obtained from simulation runs of an ultrasonic transducer energized in accordance with different energizing pulse sequences according to an embodiment of the present application.
Figure 10:
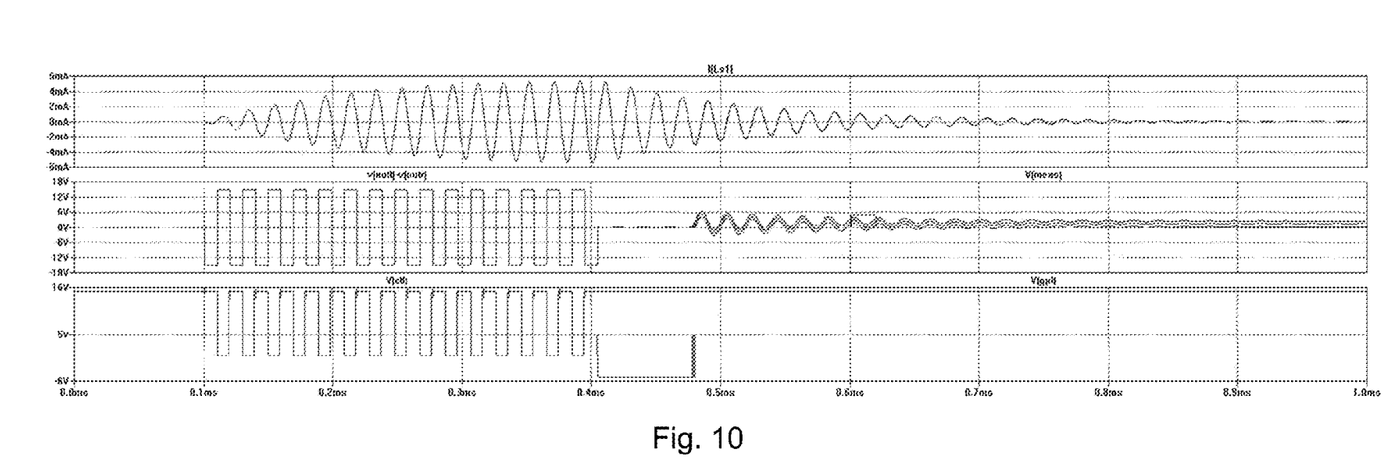
Figure 11:
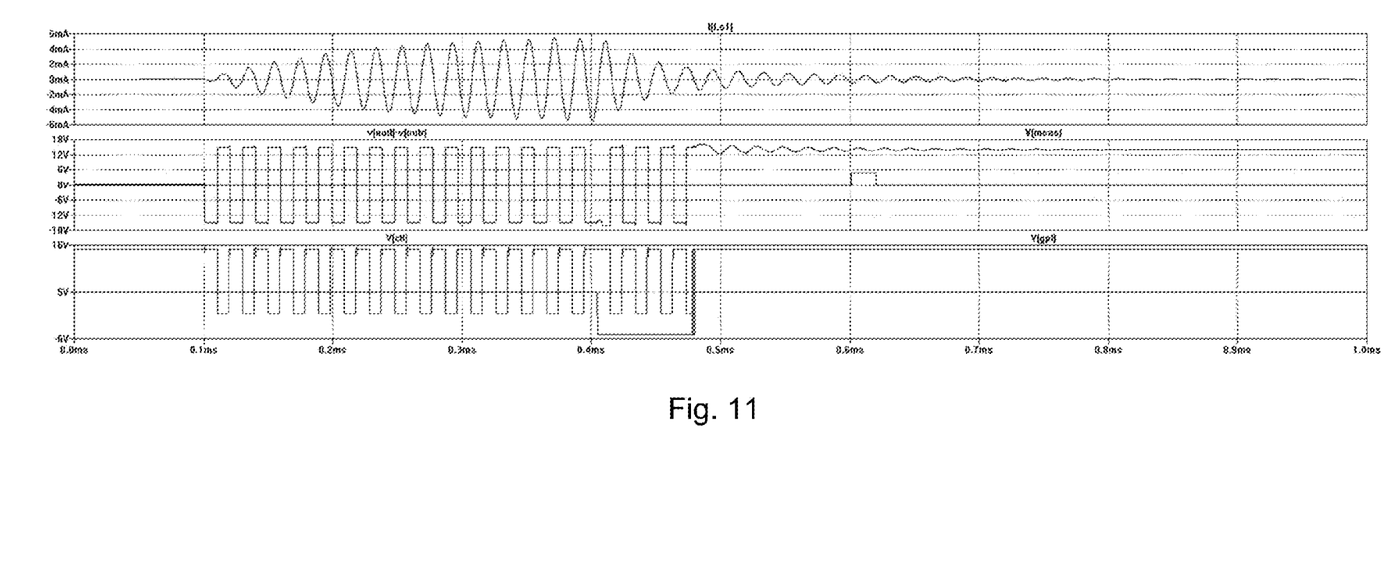

Each of FIGS. 9 to 11 show diagrams, which relate to a current flow in time through the simulated ultrasonic transducer, cf. top diagram, the voltage over time across the simulated ultrasonic transducer, cf. center diagram, and the voltage over time at one of the gates of the H-bridge circuitry as illustrated in FIG. 3. A peak-to-peak voltage is determined from the voltage over time across the simulated ultrasonic transducer at a fixed time of 200 µs (microseconds) after the last excitation pulse as indicated in the center diagram of each of FIGS. 9 to 11.

For the simulation run shown in FIG. 9, the sequence to energize the simulated ultrasonic transducer only comprises an excitation sequence without cancellation sequence. For the simulation run shown in FIG. 10, the sequence to energize the simulated ultrasonic transducer also only comprises an excitation sequence without cancellation sequence and the ultrasonic transducer is coupled to ground for a defined period of time after the excitation sequence is completed. For the simulation run shown in FIG. 11, the sequence to energize the simulated ultrasonic transducer comprises an excitation sequence as well as a cancellation phase with fractional pulse. The peak-to-peak voltages determined from the simulation runs are as following:

| FIG. 9: No cancellation | 2.958 V |
|---|---|
| FIG. 10: Short to Ground | 2.80 V |
| FIG. 11: Cancellation with fractional pulse | 1.27 V |

Accordingly, a cancellation phase with fractional pulse following an excitation phase of an ultrasonic transducer significantly reduces the ringing characteristic of the excited ultrasonic transducer and shortens the ringing phase, which enables a detection of less distant objetions when using such energized ultrasonic transducer in an ultrasonic distance sensing system.

Those skilled in the art appreciate on the above description that the configurable pulse generator take into account that the resonant characteristic of one or more ultrasonic transducers in a distance sensing system is determined by several properties including the resonant characteristic of the ultrasonic transducers, the interconnecting of the ultrasonic transducers and the transmitting circuit including the energizing circuit. The configurability allows for adjusting the energizing pulse sequence to properties determining the resonance characteristic and hence the ringing experienced upon applying the energizing pulse sequence. Moreover, the configurability allows for individually adjusting the energizing pulse sequence to varying properties of individual products in a series production. The configurable parameters applied to generate the energizing pulse sequence may be determined in a calibration process, which may be performed on a reference ultrasonic distance sensing system or on each individual ultrasonic distance sensing system.

According to an example of the present invention, a pulse generator for energizing an ultrasonic transducer is provided. The pulse generator (150) is arranged to generate an excitation pulse sequence comprising a first number of pulses; to generate a cancellation pulse sequence comprising at least a fractional pulse; and to output at an output of the pulse generator (150) the excitation pulse sequence and the cancellation pulse sequence forming an energizing pulse sequence. The output of the pulse generator (150) is coupled to a transmitting circuit (300) for energizing the ultrasonic transducer (200). The cancellation pulse sequence is shifted in phase of about 180° in relation to the excitation pulse sequence.

According to an example of the present invention, the cancellation pulse sequence comprising a second number of pulses followed by the fractional pulse.

According to an example of the present invention, the pulse generator (150) further comprises a clock generator (110), which supplies a clock signal, and a configurable controller (100) coupled to the clock generator (110). The clock signal is a common reference for determining the duration of the pulse. The configurable controller (100) is arranged to generate the excitation and cancellation pulse sequences.

According to an example of the present invention, the configurable controller (100) is further arranged to accept configuration parameters including an excitation sequence length relating to the first number of pulses and a fractional duration relating to the length of the fractional pulse. According to an example of the present invention, the configuration parameters further include a cancellation sequence length relating to the second number of pulses.

According to an example of the present invention, the configuration parameters further comprises a predefined first period of time and a predefined second period of time. The predefined first period of time may correspond to the hold high time and the predefined second period of time may correspond to the hold low time. The predefined first period of time relates to a duration, during which a generated pulse is at first level. The predefined second period of time relates to a duration, during which a generated pulse is at second level. The first level and second level may correspond to the high level and low level, or vice versa. In particular, the energizing pulse sequence is a time-varying bi-level signal, more particularly, the energizing pulse sequence is a periodic pulse signal.

According to an example of the present invention, the pulses of the excitation and cancellation sequences are square pulses with a configurable duty cycle.

According to an example of the present invention, the pulse generator (150) is part of a transmitter circuit (300) for energizing the ultrasonic transducer (200).

According to an example of the present invention, an ultrasonic distance sensing system is provided, which comprises an ultrasonic transducer (200), a transmitting circuit (300) and a pulse generator (150) as aforementioned. The pulse generator (150) is coupled to the transmitting circuit (300) and is arranged to generate an energizing pulse sequence for energizing the ultrasonic transducer (200).

According to an example of the present invention, the ultrasonic distance sensing system further comprises a transmission circuit (300) with four transistors (211 to 214) in an H-bridge arrangement. The gates of the transistors (211 to 214) are each coupled to the pulse generator (150) and are pairwise switched into conducive state on the basis of the energizing pulse sequence output by the pulse generator (150) such that a current flows through the ultrasonic transistor (200) in alternating directions.

According to an example of the present invention, a method of energizing an ultrasonic transducer (200) is provided. The method comprises generating an excitation pulse sequence comprising a first number of pulses; generating a cancellation pulse sequence comprising at least a fractional pulse; and outputting the excitation pulse sequence and the cancellation pulse sequence forming an energizing pulse sequence to the ultrasonic transducer (200). The cancellation pulse sequence is shifted in phase of about 180° in relation to the excitation pulse sequence. The ultrasonic transducer (200) is energized in accordance with the energizing pulse sequence.

According to an example of the present invention, the energizing pulse sequence is applied to the ultrasonic transducer (200) arranged in an H-bridge arrangement of a transmitting circuit (300) to control a current flow in alternating directions through the ultrasonic transducer (200).

According to an example of the present invention, the cancellation pulse sequence further comprises a second number of pulses. The generating of the cancellation pulse sequence further comprises generating a pulse sequence comprising the second number of pulses; and immediately afterwards generating the factional pulse.

According to an example of the present invention, the excitation pulse sequence is an excitation square pulse sequence.

According to an example of the present invention, the cancellation pulse sequence is a cancellation square pulse sequence.

According to an example of the present invention, the generating the excitation pulse sequence further comprises generating one or more pulses at an output by driving the output at a first level for a first predetermined period of time; and driving the output at a second level for a second predetermined period of time. The energizing pulse sequence is provide at the output.

According to an example of the present invention, the generating of the fraction pulse further comprises at least one of: driving an output at the second level for a third predetermined period of time; and driving the output at a second level for a second period of time and driving the output at the first level for a third predetermined period of time. In the first alternative, the third predetermined period of time is shorter than the second predetermined period of time and in the second alternative, the third predetermined period of time is shorter than the first predetermined period of time.

According to an example of the present invention, the generating of the cancellation pulse sequence further comprises generating one or more pulses at the output by driving the output at the second level for the first predetermined period of time; and driving the output at a first level for the second predetermined period of time.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To illustrate clearly this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

The invention claimed is:

1. A pulse generator for energizing an ultrasonic transducer, wherein the pulse generator is arranged to
    generate an excitation pulse sequence comprising a first number of pulses;
    generate a cancellation pulse sequence comprising at least a fractional pulse, wherein the cancellation pulse sequence has a phase shift of about 180° in relation to the excitation pulse sequence; and
    provide at an output of the pulse generator the excitation pulse sequence and the cancellation pulse sequence forming an energizing pulse sequence for energizing the ultrasonic transducer.

2. The pulse generator according to claim 1, further comprising:
    wherein the cancellation pulse sequence comprising a second number of pulses followed by the fractional pulse.

3. The pulse generator according to claim 1, further comprising:
    a clock generator supplying a clock signal, wherein the clock signal is a common reference for determining the duration of the pulse; and
    a configurable controller coupled to the clock generator for receiving the clock signal and arranged to generate the excitation and cancellation pulse sequences.

4. The pulse generator according to claim 3,
    wherein the configurable controller is arranged to accept configuration parameters including an excitation sequence length relating to the first number of pulses and a fractional duration relating to the length of the fractional pulse.

5. The pulse generator according to claim 4,
    wherein the configuration parameters further include a cancellation sequence length relating to the second number of pulses.

6. The pulse generator according to claim 4,
    wherein the configuration parameters further comprises a predefined first period of time and a predefined second period of time,
    wherein the predefined first period of time relates to a duration, during which a generated pulse of the energizing pulse sequence is at a first level,
    wherein the predefined second period of time relates to a duration, during which a generated pulse of the energizing pulse sequence is at a second level.

7. The pulse generator according to claim 1, further comprising:
    wherein the pulses of the excitation and cancellation sequences are square pulses with a configurable duty cycle.

8. The pulse generator according to claim 1, further comprising:
    wherein the pulse generator is part of a transmitter circuit for energizing the ultrasonic transducer.

9. An ultrasonic distance sensing system comprising:
an ultrasonic transducer; and
a pulse generator as claimed in claim 1, wherein the pulse generator is arranged to generate an energizing pulse sequence for energizing ultrasonic transducer.

10. The ultrasonic distance sensing system according to claim 9, further comprising:
a transmission circuit comprising four transistors in an H-bridge arrangement, wherein the gates of the transistors are each coupled to the pulse generator and are pairwise switched conducive on the basis of the energizing pulse sequence output by the pulse generator.

11. A method of energizing an ultrasonic transducer, said method comprising:
generating an excitation pulse sequence comprising a first number of pulses;
generating a cancellation pulse sequence comprising at least a fractional pulse, wherein the cancellation pulse sequence has a phase shift of about 180° in relation to the excitation pulse sequence; and
outputting the excitation pulse sequence and the cancellation pulse sequence forming an energizing pulse sequence to the ultrasonic transducer, wherein the ultrasonic transducer is energized in accordance with the energizing pulse sequence.

12. The method according to claim 11,
wherein the energizing pulse sequence is applied to the ultrasonic transducer arranged in an H-bridge arrangement to control a current flow in alternating directions through the ultrasonic transducer.

13. The method according to claim 11,
wherein the cancellation pulse sequence further comprises a second number of pulses,
wherein the generating of the cancellation pulse sequence comprises:
generating a pulse sequence comprising the second number of pulses; and
immediately afterwards generating the factional pulse.

14. The method according to claim 11,
wherein the excitation pulse sequence is an excitation square pulse sequence.

15. The method according to claim 11,
wherein the cancellation pulse sequence is a cancellation square pulse sequence.

16. The method according to claim 11,
wherein the generating the excitation pulse sequence further comprises generating one or more pulses at an output by
driving the output at a first level for a first predetermined period of time; and
driving the output at a second level for a second predetermined period of time,
wherein the energizing pulse sequence is provide at the output.

17. The method according to claim 16,
wherein the generating of the fraction pulse of the cancellation pulse sequence further comprises at least one of:
driving an output at the second level for a third predetermined period of time, wherein the third predetermined period of time is shorter than the second predetermined period of time; and
driving the output at a second level for a second period of time and driving the output at the first level for a third predetermined period of time, wherein the third predetermined period of time is shorter than the first predetermined period of time.

18. The method according to claim 16,
wherein the generating of the cancellation pulse sequence further comprises generating one or more pulses at the output by
driving the output at the second level for the first predetermined period of time; and
driving the output at a first level for the second predetermined period of time.

19. The pulse generator according to claim 2, further comprising:
a clock generator supplying a clock signal, wherein the clock signal is a common reference for determining the duration of the pulse; and
a configurable controller coupled to the clock generator for receiving the clock signal and arranged to generate the excitation and cancellation pulse sequences.

20. The method according to claim 17,
wherein the generating of the cancellation pulse sequence further comprises generating one or more pulses at the output by
driving the output at the second level for the first predetermined period of time; and
driving the output at a first level for the second predetermined period of time.

* * * * *